(12) United States Patent
Park et al.

(10) Patent No.: US 8,080,843 B2
(45) Date of Patent: Dec. 20, 2011

(54) NONVOLATILE MEMORY DEVICES AND METHODS OF FORMING THE SAME

(75) Inventors: Jin-Taek Park, Gyeonggi-do (KR); Won-Seok Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/152,307

(22) Filed: Jun. 3, 2011

(65) Prior Publication Data

US 2011/0233650 A1    Sep. 29, 2011

Related U.S. Application Data

(62) Division of application No. 12/238,476, filed on Sep. 26, 2008, now Pat. No. 7,977,732.

(30) Foreign Application Priority Data

Sep. 27, 2007    (KR) .................. 10-2007-0097399

(51) Int. Cl.
*H01L 29/792* (2006.01)
*H01L 21/336* (2006.01)

(52) U.S. Cl. ..................................... 257/324

(58) Field of Classification Search ........... 257/E27.103, 257/410, E21.01, E21.272, E21.281, 314–326, 257/E27.078, E29.3–E29.309, E21.645–E21.694, 257/E27.075, 295, E21.179–E21.182, E21.209–E21.21, 257/E21.422, E21.423, 225–234, 390, E27.076, 257/E27.098–E27.101, E27.077, E21.661; 438/267, 593, 596, 746, 257, 263, 264, 424, 438/275–278
See application file for complete search history.

(56) References Cited

U.S. PATENT DOCUMENTS

| | | | | |
|---|---|---|---|---|
| 6,171,909 | B1 * | 1/2001 | Ding et al. | 438/267 |
| 7,041,554 | B2 * | 5/2006 | Lee et al. | 438/257 |
| 7,445,994 | B2 * | 11/2008 | Lee et al. | 438/257 |
| 2004/0217414 | A1 * | 11/2004 | Kim | 257/315 |
| 2005/0136601 | A1 | 6/2005 | Jang et al. | |
| 2006/0108711 | A1 * | 5/2006 | Yu | 264/293 |
| 2006/0166436 | A1 | 7/2006 | Korber | |
| 2006/0187711 | A1 | 8/2006 | Jang | |
| 2006/0208302 | A1 | 9/2006 | Shin et al. | |
| 2007/0228450 | A1 | 10/2007 | Li et al. | |
| 2008/0265304 | A1 | 10/2008 | Lee et al. | |

FOREIGN PATENT DOCUMENTS

| | | |
|---|---|---|
| KR | 1020070002381 A | 6/2004 |
| KR | 1020070051967 A | 7/2005 |
| KR | 1020070000664 A | 1/2006 |
| KR | 1020070008969 A | 1/2007 |

* cited by examiner

*Primary Examiner* — Dao H Nguyen
*Assistant Examiner* — Tram H Nguyen
(74) *Attorney, Agent, or Firm* — Myers Bigel Sibley & Sajovec

(57) ABSTRACT

Provided are nonvolatile memory devices and methods of forming nonvolatile memory devices. Nonvolatile memory devices include a device isolation layer that defines an active region in a substrate. Nonvolatile memory devices further include a first insulating layer, a nonconductive charge storage pattern, a second insulating layer and a control gate line that are sequentially disposed on the active region. The charge storage pattern includes a horizontal portion and a protrusion disposed on an upper portion of an edge of the horizontal portion.

5 Claims, 15 Drawing Sheets

NONVOLATILE MEMORY DEVICES AND METHODS OF FORMING THE SAME

CROSS-REFERENCE TO RELATED APPLICATIONS

This U.S. non-provisional patent application claims priority under 35 U.S.C. §120 as a divisional of U.S. patent application Ser. No. 12/238,476, filed Sep. 26, 2008, now U.S. Pat. No. 7,977,732 which in turn claims priority under 35 U.S.C. §119 of Korean Patent Application No. 10-2007-0097399, filed on Sep. 27, 2007, the entire contents of which are herein incorporated by reference in their entirety.

BACKGROUND OF THE INVENTION

The present invention relates to semiconductor memory devices, and more particularly, to nonvolatile memory devices and methods of forming nonvolatile memory devices.

Generally, semiconductor memory devices may be classified into volatile semiconductor memory devices and nonvolatile semiconductor memory devices. The volatile semiconductor memory devices may lose their stored data when their power supplies are interrupted while the non-volatile semiconductor memory devices generally retain their stored data even when their power supplies are interrupted.

A flash memory device is a nonvolatile memory device and may be classified into a floating gate type or a charge trap type, depending on the type of a data storage layer that constitutes a unit cell.

A charge trap type flash memory device may include a cell structure wherein a tunneling layer, a trap layer and a gate layer may be stacked. The trap layer of the flash memory device of the charge trap type may be formed on an active region and a device isolation region. That is, the trap layers of memory cells are connected to each other on the device isolation region. When the flash memory device of the charge trap type is programmed, electrons may be stored in the trap layer. Since the trap layer may also be formed on the device isolation region, electrons stored in the trap layer of the memory cell may move to the trap layer on the device isolation region. Accordingly, reliability of a memory device may be degraded. For example, the stored data may be distorted to a different data value and/or errors may occur in a program operation may move to the trap layer on the device isolation region. Accordingly, reliability of a memory device may be degraded. For example, the stored data may be distorted to a different data value and/or errors may occur in a program operation

SUMMARY OF THE INVENTION

In accordance with some embodiments of the present invention, provided are methods of forming a nonvolatile memory device. Embodiments of such methods may include forming a device isolation layer including an upper device isolation layer that protrudes upward from an active region, the device isolation layer defining the active region, forming a first insulating layer on the active region and forming a nonconductive charge storage pattern on the first insulating layer, the charge storage pattern including a horizontal portion and a protrusion on an edge of the horizontal portion. Method may include forming a second insulating layer on the charge storage pattern and forming a control gate line on the second insulating layer.

In some embodiments, forming the charge storage pattern may include uniformly forming a nonconductive charge storage layer along a profile of the first insulating layer and the upper device isolation layer, forming a sacrificial pattern on the charge storage layer between the upper device isolation layer and an adjacent upper device isolation layer, and etching the charge storage layer using the sacrificial pattern as an etching mask. Some embodiments provide that forming the sacrificial pattern includes forming a sacrificial layer on the charge storage layer and etching the sacrificial layer so as to expose the charge storage layer on the upper device isolation layer.

In some embodiments, the sacrificial layer is formed of material having an etching selectivity with respect to the charge storage layer. Some embodiments provide that the etching includes a wet etching. Some embodiments include recessing the upper device isolation layer after forming the charge storage pattern, wherein recessing the upper device isolation layer is performed by a wet etching process.

In some embodiments, recessing the upper device isolation layer includes removing the sacrificial pattern. The sacrificial pattern may be formed of same material as the upper device isolation layer and a density of the sacrificial pattern may be lower than a density of the upper device isolation layer. Some embodiments provide that a top surface of the recessed upper device isolation layer is higher than or equal to a top surface of the protrusion of the charge storage pattern.

In some embodiments, forming the device isolation layer includes forming a mask pattern on the substrate, forming a device isolation trench on the substrate using the mask pattern as an etching mask, forming a device isolation insulating layer in the device isolation trench and removing the mask pattern. Some embodiments provide that an annealing process for increasing a density of the device isolation insulating layer is performed after forming the device isolation insulating layer. In some embodiments, removing the mask pattern includes performing an isotropic etching of reducing a width of the upper device isolation layer.

Yet other embodiments of the present invention include methods of forming a nonvolatile memory device. Such methods may include forming a device isolation layer that defines an cell active region and a peripheral active region on a substrate, forming a first insulating layer on the cell active region, and forming a nonconductive charge storage pattern on the first insulating layer, the charge storage pattern including a horizontal portion and a protrusion disposed on an edge of the horizontal portion. Methods may include forming a second insulating layer on the charge storage pattern, forming a control gate line on the second insulating layer, forming a peripheral gate insulating layer on the peripheral active region, and forming a peripheral gate electrode including first and second conductive patterns stacked on the peripheral gate insulating layer.

In some embodiments, the first conductive pattern is formed before forming the first insulating layer and the second conductive pattern and the control gate line are simultaneously formed. Some embodiments provide that the first conductive pattern is formed after forming the second insulating layer and the second conductive pattern and the control gate line are simultaneously formed.

In some embodiments, the first conductive pattern is formed of doped polysilicon and the second conductive pattern is formed of metal. Some embodiments provide that the device isolation layer of a cell region is disposed between the charge storage pattern and an adjacent charge storage pattern, and a top surface of the device isolation layer of the cell region is higher than or equal to a top surface of the charge storage pattern.

Some embodiments of the present invention include nonvolatile memory devices that include a device isolation layer that defines an active region in a substrate and a first insulating layer, a nonconductive charge storage pattern, a second insulating layer and a control gate line that are sequentially stacked on the active region. Some embodiments provide that the charge storage pattern includes a horizontal portion and a protrusion disposed on an edge of the horizontal portion.

In some embodiments, the charge storage pattern includes a charge trap layer. Some embodiments provide that the device isolation layer includes an upper device isolation layer that protrudes upward from the active region and is disposed between the charge storage pattern and an adjacent charge storage pattern. In some embodiments, a top surface of the upper device isolation layer is free from the charge storage pattern. Some embodiments provide that a top surface of the device isolation layer is higher than or equal to a top surface of the protrusion of the charge storage pattern. In some embodiments, a width of the charge storage pattern is greater than a width of the active region.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
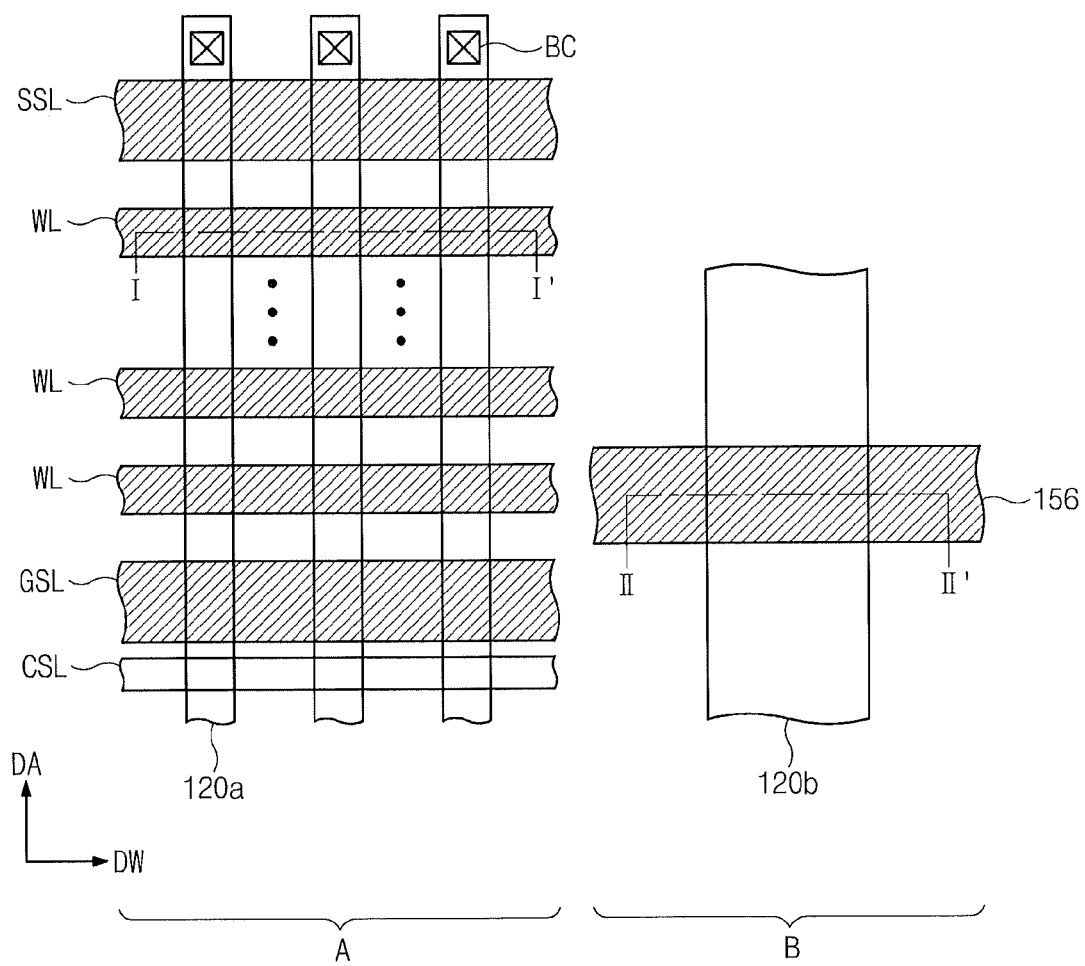
FIG. 1 is a top plan view of a nonvolatile memory device in accordance with some exemplary embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 2:
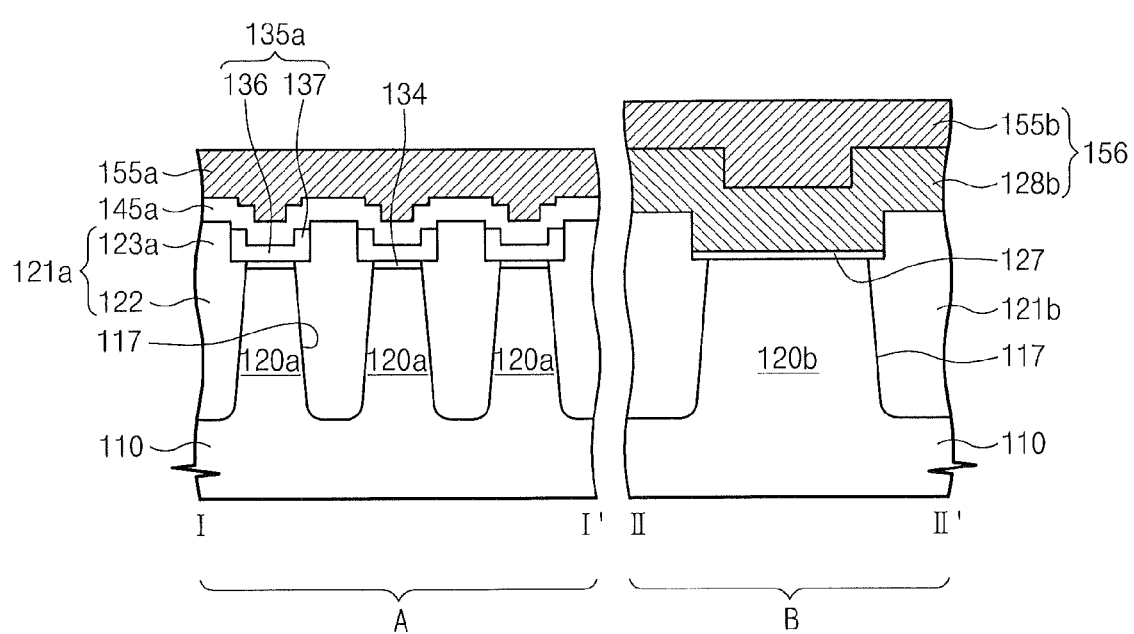
FIG. 2 is a cross sectional view taken along the lines I-I' and II-II' of FIG. 1 to illustrate a nonvolatile memory device in accordance with some exemplary embodiments of the present invention.

Referring to FIGS. 1 and 2, a nonvolatile memory device in accordance with some embodiments of the present invention is described. A substrate 110 of the nonvolatile memory device includes a cell region A and a peripheral region B.

In the cell region A, cell device isolation layers 121a define cell active regions 120a. The cell active region 120a may extend in a first direction DA. The cell device isolation layer 121a includes an upper device isolation layer 123a that protrudes upward from the cell active region 120a and a lower device isolation layer 122 under the upper device isolation layer 123a.

Some embodiments provide that a string selection line SSL and a ground selection line GSL that cross the cell active region 120a and extend in a second direction DW are disposed on the substrate 110. A bit line contact BC electrically connected to a bit line (not shown) is disposed on the cell active region 120a that is adjacent to the string selection line SSL. A common source line CSL that extends in the second direction DW is disposed to be adjacent the ground selection line GSL. A plurality of word lines are disposed between the string selection line SSL and the ground selection line GSL.

A tunneling insulating layer 134 is disposed on the cell active region 120a. In some embodiments, the tunneling insulating layer 134 may be formed of an oxide layer. A charge storage pattern 135a is disposed on the tunneling insulating layer 134. Some embodiments provide that a width of the charge storage pattern 135a may be greater than a width of the cell active region 120a. The charge storage pattern 135a may be a nonconductive charge trap layer and may include an insulating layer that has a high trap density with respect to charges. For example, in some embodiments, an insulating layer may include a nitride layer, an aluminum oxide layer ($Al_2O_3$), a hafnium oxide layer (HfO), a hafnium aluminum oxide layer (HfAlO), and/or a hafnium silicon oxide layer (HfSiO), and/or an insulating layer having a nanocrystal or quantum dot.

The charge storage pattern 135a includes a horizontal portion 136 and a protrusion 137. In some embodiments, the protrusion 137 may be disposed on an upper portion of an edge of the horizontal portion 136. In this manner, the charge storage pattern 135a may have a cross section of "U" shape. The upper device isolation layer 123a is disposed between the charge storage patterns 135a. In some embodiments, a top surface of the upper device isolation layer 123a may be the same height as a top surface of the protrusion 137 of the charge storage pattern 135a. Some embodiments provide that a top surface of the upper device isolation layer 123a may be higher than a top surface of the protrusion 137 of the charge storage pattern 135a.

A blocking insulating layer pattern 145a that extends in the second direction DW is disposed on the charge storage pattern 135a and the cell device isolation layer 121a. In some embodiments, the blocking insulating layer pattern 145a may include a high dielectric-constant material such as an aluminum oxide layer ($Al_2O_3$), hafnium oxide ($HfO_2$), hafnium aluminate ($Hf_{1-x}AlO_y$), hafnium silicate ($Hf_xSi_{1-x}O_2$, hafnium silicon oxynitride (Hf—Si-oxynitride), zirconium oxide ($ZrO_2$), zirconium silicate ($Zr_xSi_{1-x}O_2$), and/or zirconium silicon oxynitride (Zr—Si-oxynitride).

A control gate line 155a that extends in the second direction DW is disposed on the blocking insulating layer 145a. In some embodiments, the control gate line 155a may include a conductive material (e.g., metal). The control gate line 155a may function as a word line WL.

In the peripheral region B, peripheral device isolation layers 121b may define peripheral active regions 120b. A peripheral gate insulating layer 127 is disposed on the peripheral active region 120b. In some embodiments, the peripheral gate insulating layer 127 may be a thermal oxidation layer.

A peripheral gate electrode 156 that crosses the peripheral active region 120b is disposed on the peripheral gate insulating layer 127. Some embodiments provide that the peripheral gate electrode 156 may include conductive patterns 128b and 155b that are stacked. In some embodiments, a lower conductive pattern 128b may include a doped polysilicon and an upper conductive pattern 155b may include metal. The upper conductive pattern 155b may include a material that is substantially the same as a material included in the control gate line 155a of the cell region.

According to embodiments described above, a top surface of the cell device isolation layer 121a may be free from the charge storage pattern 135a. In other words, the charge storage pattern 135a is disposed on the cell active region 120a but not on the cell device isolation layer 121a. In this regard, when a program operation is performed, data stored in the charge storage pattern 135a is maintained because movement of electrons stored in the charge storage pattern 135a may be reduced and/or eliminated. The upper device isolation layer 123a that has a top surface higher than a top surface of the charge storage pattern 135a is disposed between the charge storage patterns 135a to provide a sufficient distance between the tunneling insulating layer 134 and the control gate line 155a. In this manner, the affect on the tunneling insulating layer 134 by the control gate line 155a can be minimized. For example, insulation breakdown may be reduced and/or minimized.

Figure 3:
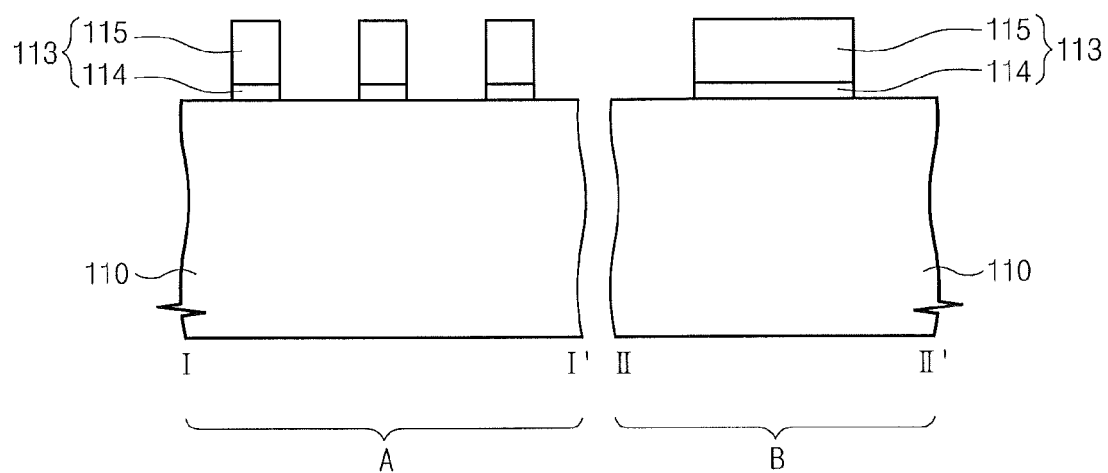
FIGS. 3 to 14 are cross sectional views taken along the lines I-I' and II-II' of FIG. 1 to illustrate a method of forming a nonvolatile memory device in accordance with some exemplary embodiments of the present invention.

Referring to FIGS. 3 to 14, some exemplary embodiments of methods of forming nonvolatile memory devices in accordance with the present invention are described. Referring to FIG. 3, a substrate 110 includes a cell region A and a peripheral region B. A mask pattern 113 is formed on the substrate 110. Some embodiments provide that the mask pattern 113 may include a pad oxide layer pattern 114 and a nitride layer pattern 115.

Figure 4:
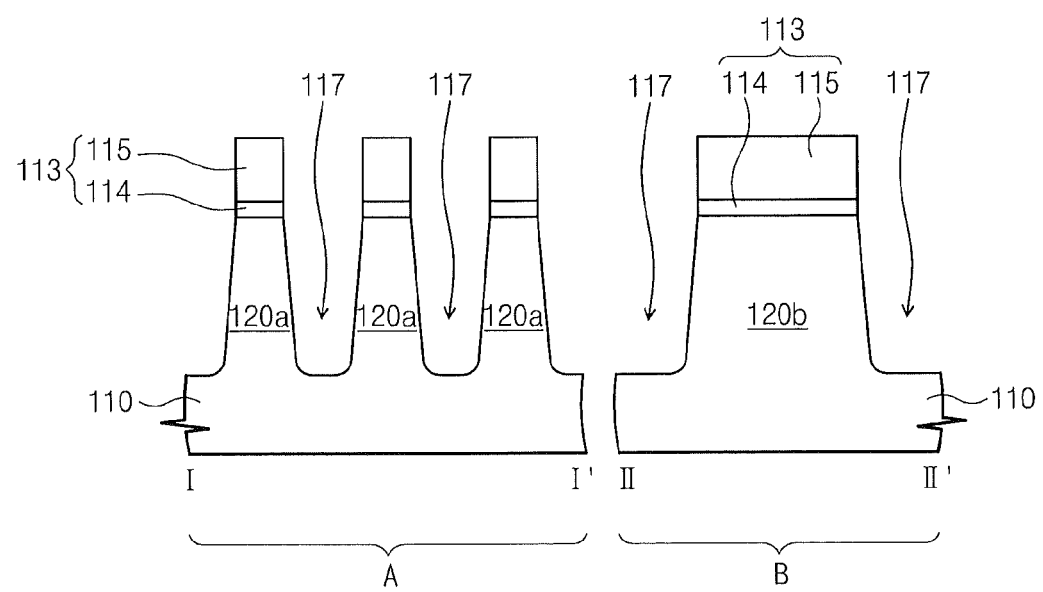

Referring to FIG. 4, the substrate 110 is etched using the mask pattern 113 as an etch mask to form a device isolation trench 117. A cell active region 120a and a peripheral active region 120b are defined by the device isolation trench 117.

Figure 5:
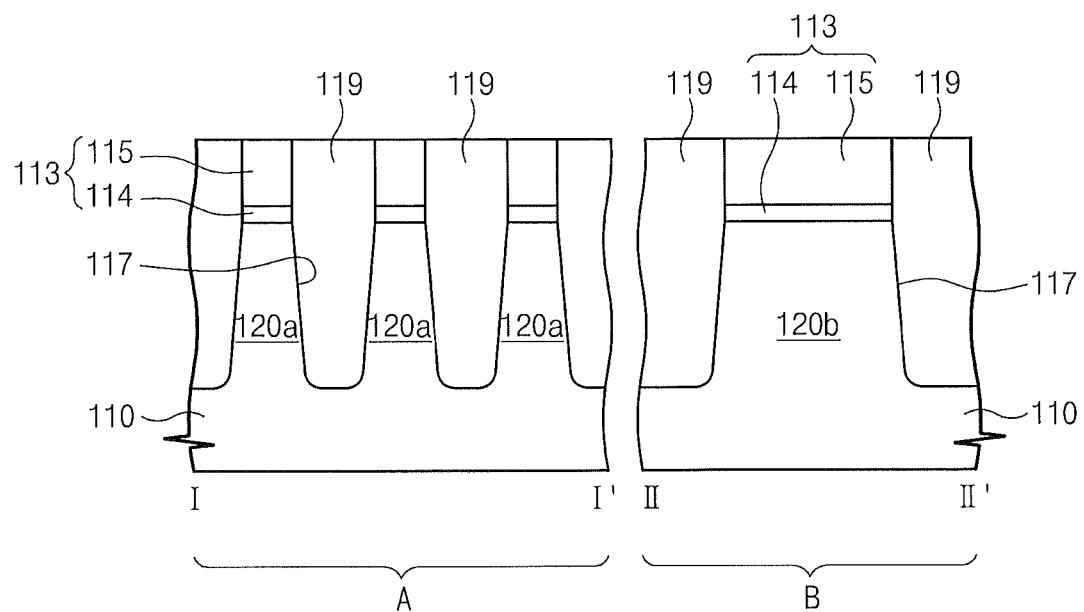

Referring to FIG. 5, a device isolation insulating layer 119 is formed in the device isolation trench 117. An insulating layer filling the device isolation trench 117 may be formed using a chemical vapor deposition (CVD) process. The insulating layer may be planarized down to a top surface of the mask pattern 113 to form the device isolation insulating layer 119. Some embodiments provide that the device isolation insulating layer 119 may be formed with a silicon oxide such as, for example, undoped silicate glass (USG). After the device isolation insulating layer 119 is formed, an annealing process for increasing density may be additionally performed to obtain a tolerance to a subsequent wet etching.

Figure 6:
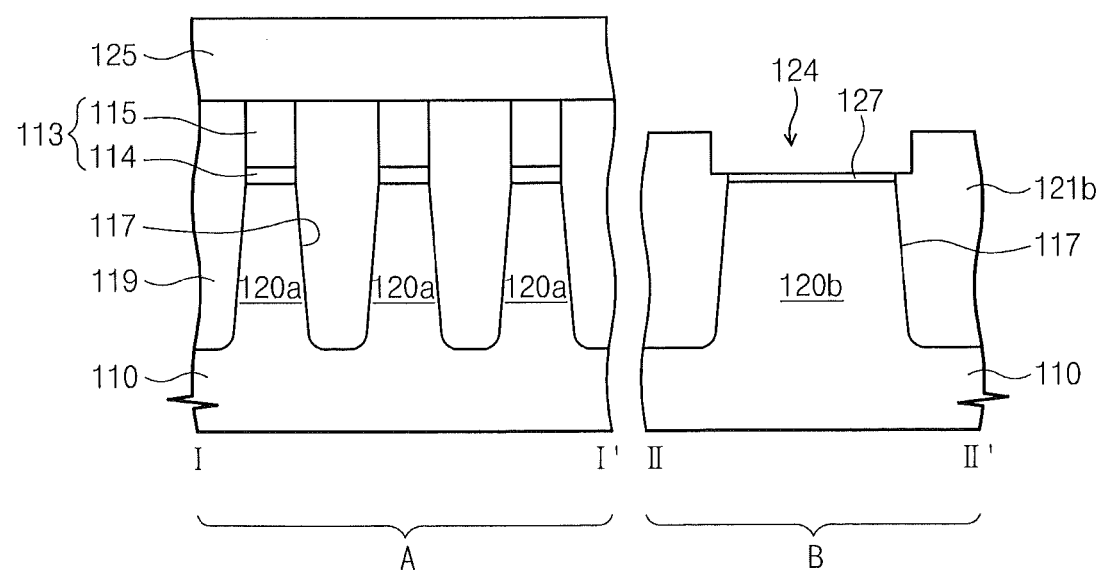

Referring to FIG. 6, after a mask pattern 125 is formed on the cell region A, the mask pattern 113 on the peripheral region B is removed. The mask pattern 125 may be formed with material having an etching selectivity with respect to the nitride layer pattern 115. The nitride layer pattern 115 may be removed by a wet etching using an etching solution including phosphoric acid. The pad oxide layer 114 may be removed by a wet etching using an etching solution (e.g., LAL solution) including, for example, hydrofluoric acid (HF). When the pad oxide layer pattern 114 is removed, the device isolation insulating layer 119 of the peripheral region B may be isotropically etched to form a peripheral device isolation layer 121b. The peripheral device isolation layer 121b may include a portion protruded upward from the peripheral active region 120b. A width and a height of the protruded portion of the peripheral device isolation layer 121b may be reduced as compared with the device isolation layer 119 due to the etching. A gap region 124 corresponding to a region where the mask pattern 113 is removed may be defined. The gap region 124 exposes the peripheral active region 120b and a width of the gap region 124 may be greater than a width of the mask pattern 113 due to the etching.

A peripheral gate insulating layer 127 is formed on an exposed peripheral active region 120b. The peripheral gate insulating layer 127 may be formed with silicon oxide by performing a thermal oxidation process.

Figure 7:
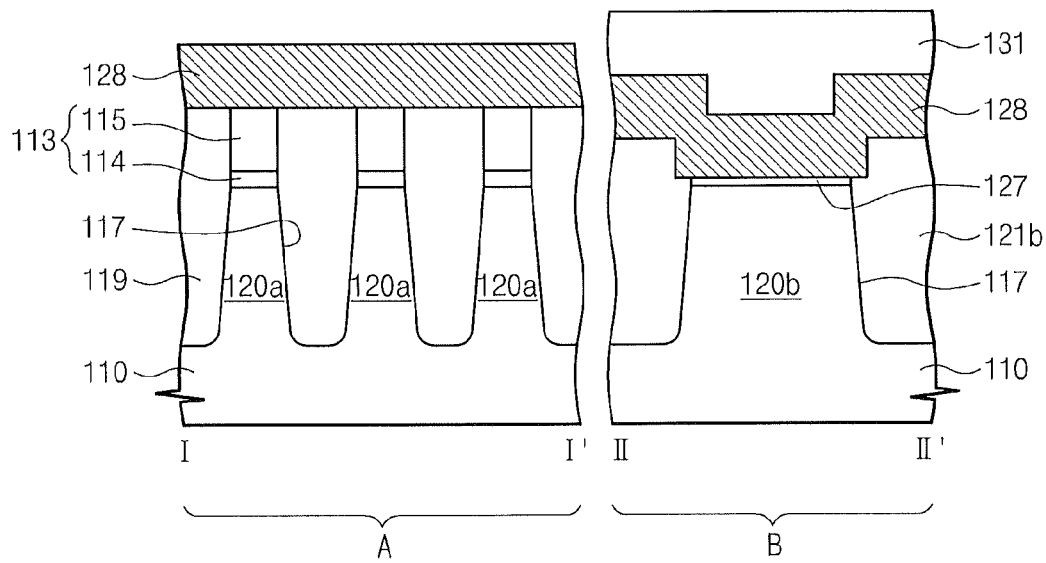

Referring to FIG. 7, a conductive layer 128 filling the gap region 124 is formed on the substrate 110. The conductive layer 128 may be formed with doped polysilicon by performing a chemical vapor deposition (CVD) process. A mask pattern 131 is formed on the conductive layer 128 of the peripheral region B. Some embodiments provide that the mask pattern 131 may be formed of a nitride layer.

Figure 8:
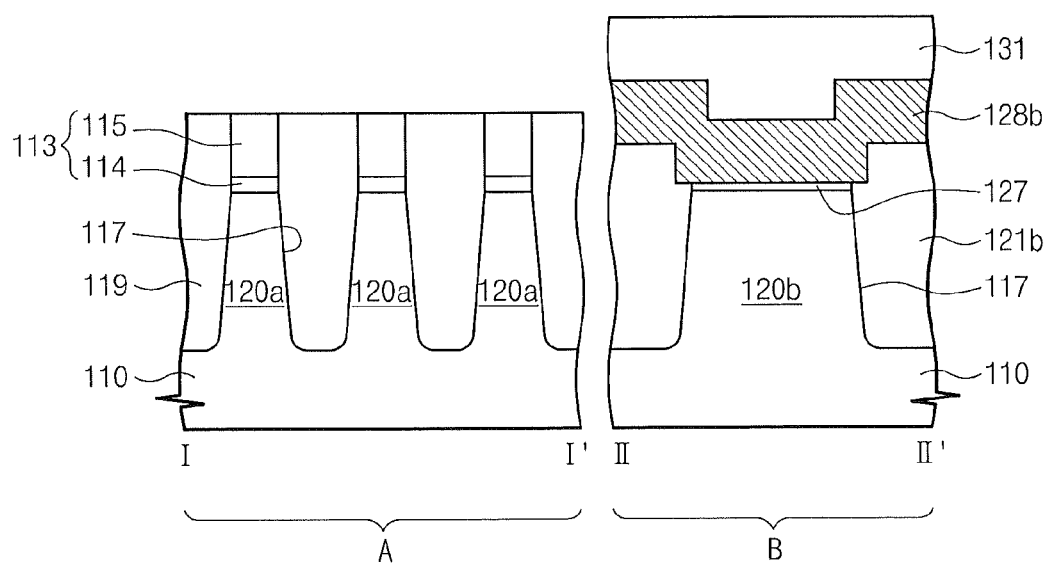

Referring to FIG. 8, the conductive layer 128 is etched using the mask pattern 131 as an etching mask to form a conductive pattern 128b on the peripheral region B. The device isolation insulating layer 119 and the nitride layer pattern 115 of the cell region A are exposed by the etching.

Figure 9:
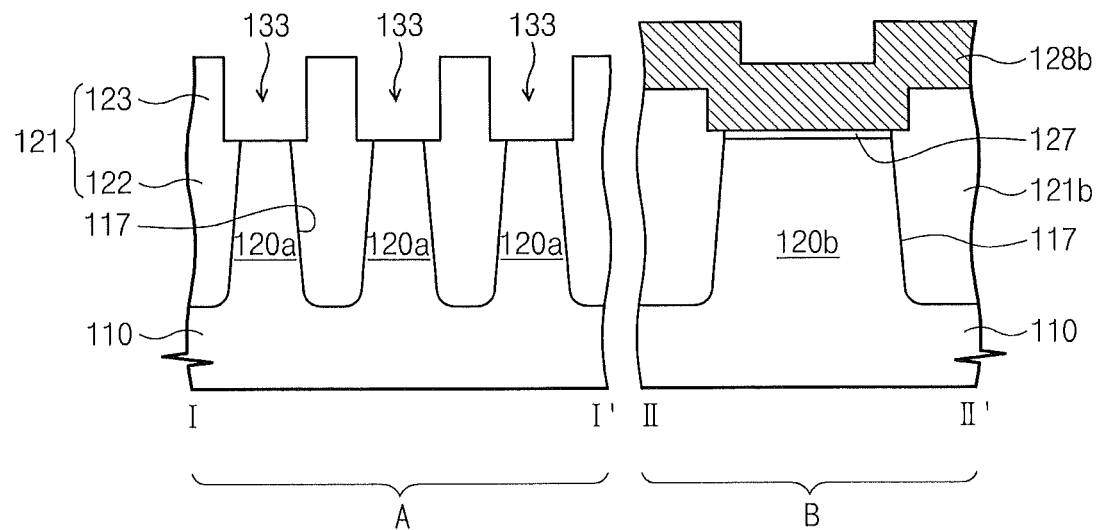

Referring to FIG. 9, the mask pattern 113 of the cell region A and the mask pattern 131 of the peripheral region B are removed by performing an etching. The nitride layer pattern 115 and the mask pattern 131 may be simultaneously or sequentially removed. In a case that the mask pattern 131 is formed of a nitride layer, the nitride layer pattern 115 and the mask pattern 131 may be simultaneously removed by a wet etching using an etching solution including, for example, phosphoric acid.

The pad oxide layer pattern 114 of the cell region A may be removed by a wet etching using an etching solution including hydrofluoric acid (HF). A cell device isolation layer 121 is formed by the etching. Some embodiments provide that the cell device isolation layer 121 may include an upper device isolation layer 123 that protrudes upward from the cell active region 120a and a lower device isolation layer 122 that is under the upper device isolation layer 123. A portion of the upper device isolation layer 123 may be removed by the etching. In this regard, a width of the upper device isolation layer 123 may be reduced and a width of a gap region 133 may be increased. After removing the pad oxide layer pattern 114, additional etching process is performed to widen a width of the gap region 133. The gap region 133 that exposes the cell active region 120a is defined by the device isolation layer 123.

Figure 10:
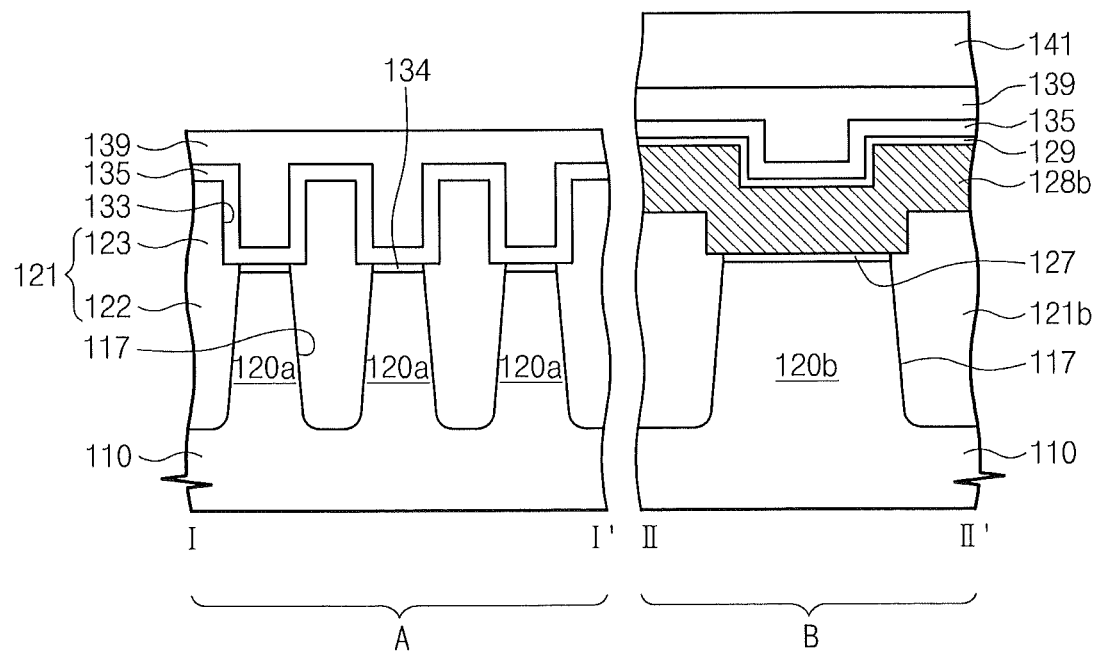

Referring to FIG. 10, a tunneling insulating layer 134 is formed on the cell active region A. The tunneling insulating layer 134 may be formed of silicon oxide by performing a thermal oxidation process. Some embodiments provide that an oxide layer may be formed on the conductive pattern 128b of the peripheral region B by a thermal oxidation process.

In some embodiments, a charge storage layer 135 may be uniformly formed along a profile of the tunneling insulating layer 134 and the upper device isolation layer 123. The charge storage layer 135 may be formed of an insulating layer having a high trap density with respect to charges such as a nitride layer, an aluminum oxide layer ($Al_2O_3$), a hafnium oxide layer (HfO), a hafnium aluminum oxide layer (HfAlO), and/or a hafnium silicon oxide layer (HfSiO), among others by performing, for example, an atomic layer deposition (ALD) process. The charge storage layer 135 may be also formed of an insulating layer including nanocrystal and/or quantum dot, among others.

A sacrificial layer 139 filling the gap region 133 is formed on the charge storage layer 135. The sacrificial layer 139 may be formed of material having an etching selectivity with respect to the charge storage layer 135. Some embodiments provide that the sacrificial layer 139 may be formed of material having an etching selectivity with respect to the device isolation layer 121. For example, the sacrificial layer 139 may be formed of material having an etching rate higher than an etching rate of the device isolation layer and lower than an etching rate of the charge storage layer 135.

The sacrificial layer 139 and the device isolation layer 121 may be formed of the same material (e.g., a silicon oxide such as USG) and an etching selectivity with respect to each other may be controlled by performing an annealing process. That is, a density of the device isolation layer 121 may become high by annealing the device isolation layer 121. In contrast, a density of the sacrificial layer 139 may become lower than the device isolation layer 121 by annealing the sacrificial layer 139 under a different condition (e.g., a temperature or time) from the device isolation layer 121 or by not annealing the sacrificial layer 139. Accordingly, even though the sacrificial layer 139 and the device isolation layer 121 are formed of the same material, they may have an etching selectivity with respect to each other and the sacrificial layer 139 may be formed to have an etch rate higher than the device isolation layer 121.

A mask pattern 141 is formed on the sacrificial layer 139 of the peripheral region B.

Figure 11:
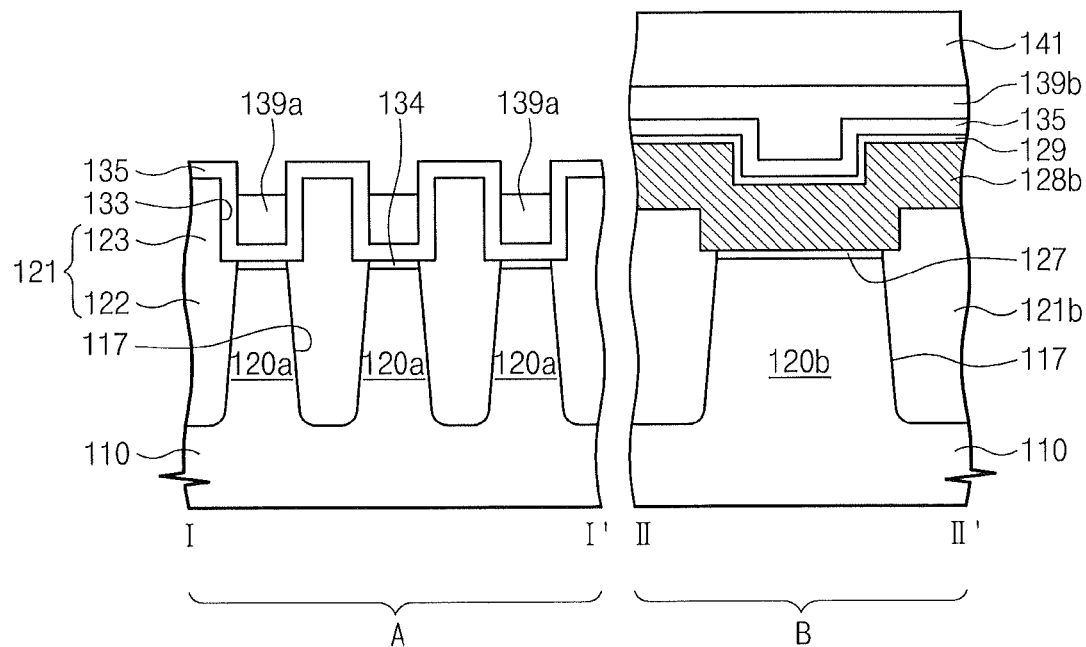

Referring to FIG. 11, the sacrificial layer 139 is etched using the mask pattern 141 as an etch mask to form sacrificial patterns 139a and 139b on the cell and peripheral regions A and B. Some embodiments provide that the etching may be a wet etching using an etching solution including hydrofluoric acid (HF). The sacrificial pattern 139a is formed in the gap region 133 and the charge storage layer 135 on the upper device isolation layer 123 between the sacrificial patterns 139a may be exposed.

Figure 12:
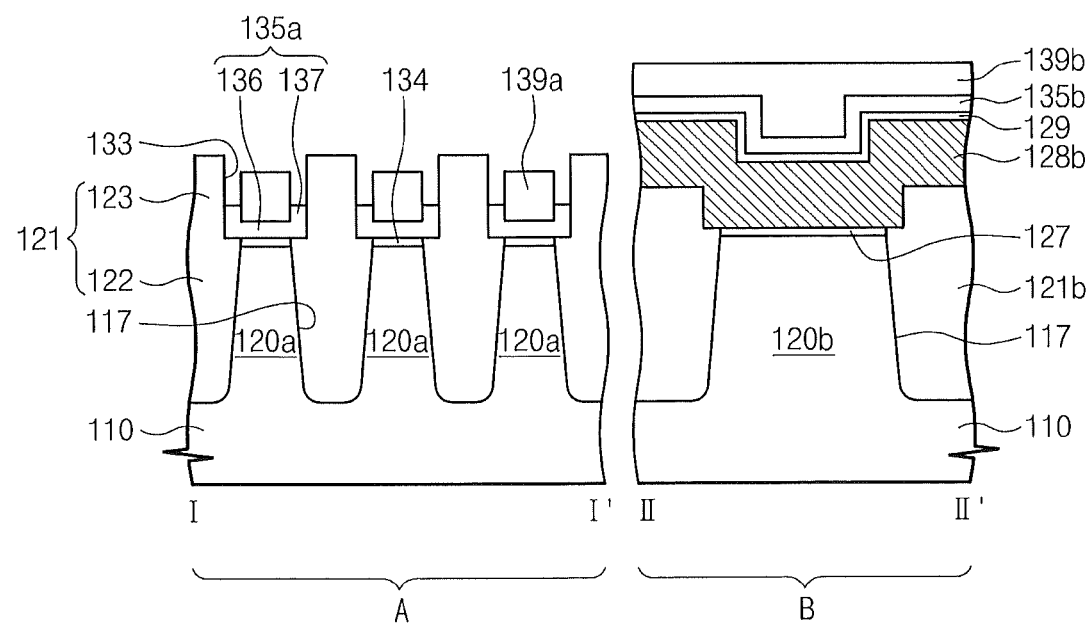

Referring to FIG. 12, after the mask pattern 141 is removed, the charge storage layer 135 is etched using the sacrificial patterns 139a and 139b as an etch mask to form charge storage patterns 135a and 135b on the cell and peripheral regions A and B, respectively. Since the charge storage pattern 135b of the peripheral region B is protected by the mask pattern 141, it may not be etched and may remain connected on the peripheral device isolation layer 121b. However, the charge storage pattern 135a is etched on the cell device isolation layer 121 and divided. Thus, the charge storage pattern 135a is formed only in a lower portion of the gap region 133.

The charge storage pattern 135a of the cell region A may include a horizontal portion 136 and at least one protrusion 137. The protrusion 137 is formed on an edge of the horizontal portion 136. Some embodiments provide that the charge storage pattern 135a may have a cross section of a "U" shape and may surround a lower portion of the sacrificial pattern 139a.

Figure 13:
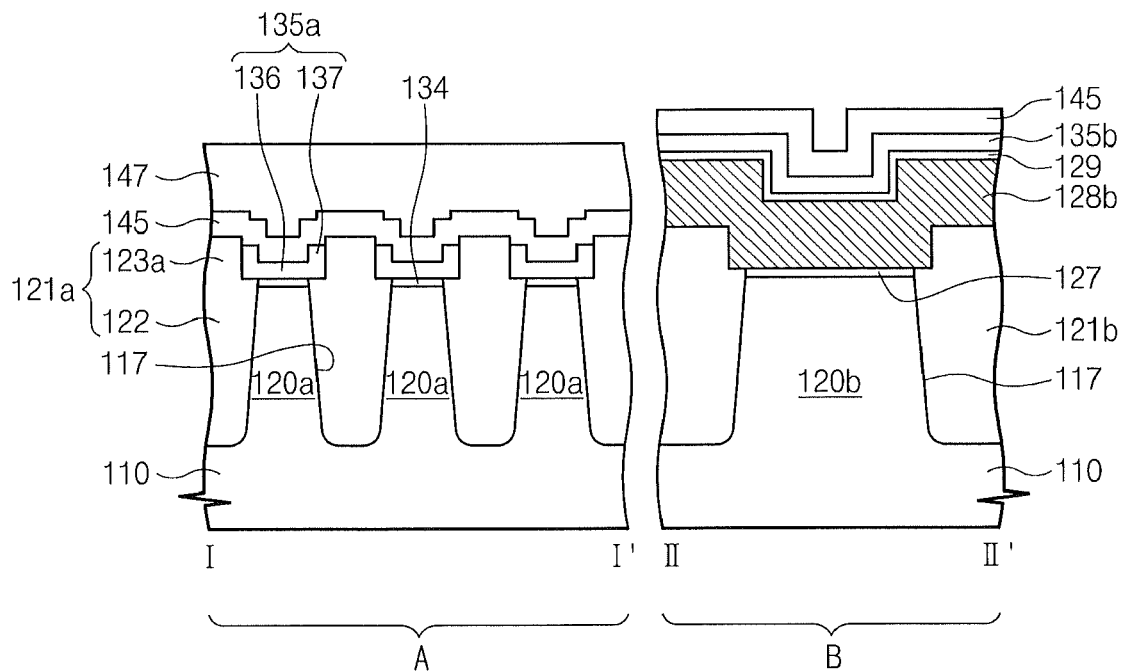

Referring to FIG. 13, an etching process is performed to recess the upper device isolation layer 123. A recessed device isolation layer 121a is formed. A top surface of a recessed upper device isolation layer 123a may be higher than a top surface of the protrusion 137 of the charge storage pattern 135a. Some embodiments provide that the top surface of the recessed upper device isolation layer 123a may have same height as the top surface of the protrusion 137 of the charge storage pattern 135a. The sacrificial patterns 139a and 139b may be etched and removed. As described above, because the density of the sacrificial patterns 139a and 139b are lower than the density of the device isolation layer 121, an etch rate of the sacrificial patterns 139a and 139b may be higher than an etch rate of the device isolation layer 121. As a result, the sacrificial patterns 139a and 139b may be removed while the upper device isolation layer 123 is recessed.

A blocking insulating layer 145 is formed on the recessed device isolation layer 121a and the charge storage patterns 135a and 135b. The blocking insulating layer 145 may be formed of a high dielectric material such as an aluminum oxide layer ($Al_2O_3$), hafnium oxide ($HfO_2$), hafnium aluminate ($Hf_{1-x}AlO_y$), hafnium silicate ($Hf_xSi_{1-x}O_2$), hafnium silicon oxynitride (Hf—Si-oxynitride), zirconium oxide ($ZrO_2$), zirconium silicate ($ZrxSi_{1-x}O_2$), and/or zirconium silicon oxynitride (Zr—Si-oxynitride), among others, by performing a chemical vapor deposition (CVD) process. The blocking insulating layer 145 may further include a barrier layer such as a silicon oxide layer for preventing a leakage current on an upper portion and/or under a lower portion of the blocking insulating layer 145. A mask pattern 147 is formed on the blocking insulating layer 145 of the cell region A.

Figure 14:
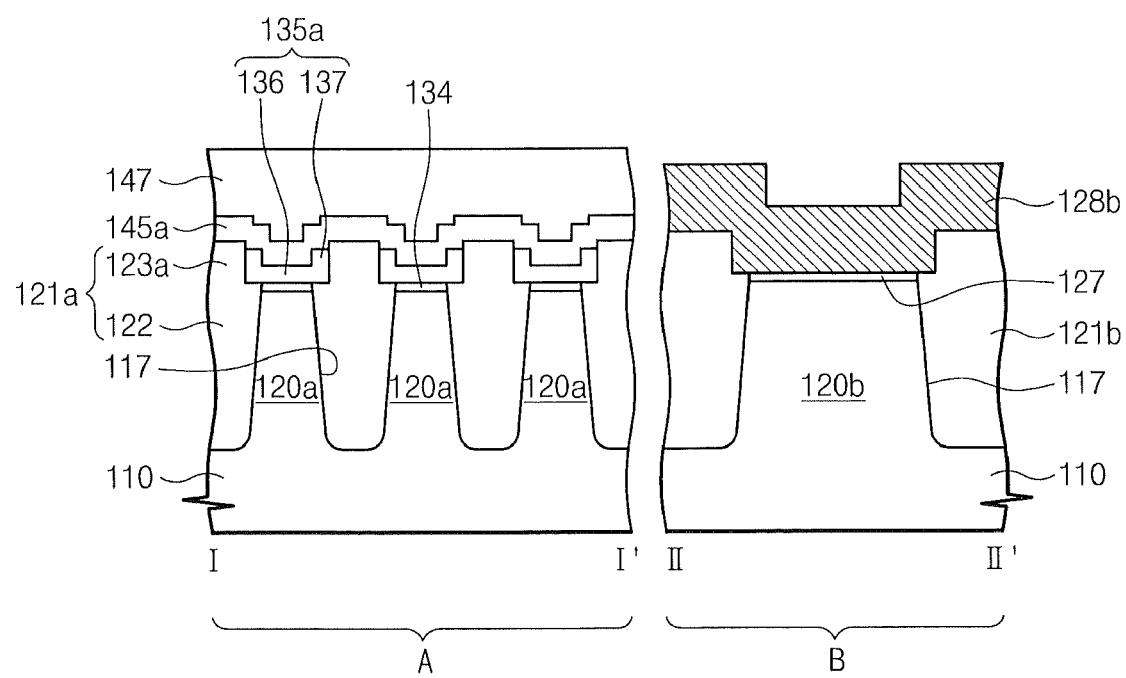

Referring to FIG. 14, the blocking insulating layer 145, the charge storage pattern 135b and the oxide layer 129 of the peripheral region B are etched using the mask pattern 147 as an etch mask. In this manner, the conductive pattern 128b may be exposed. A blocking insulating pattern 145a is formed on the cell region A.

Referring to FIG. 2 again, after a conductive layer is formed on the substrate 110, the conductive layer is patterned to form the conductive pattern 155a on the cell region A and the conductive pattern 155b on the peripheral region B. Some embodiments provide that the conductive layer may be formed of metal. The conductive pattern 155a may function as a control gate line. The conductive pattern 155b may function as a gate electrode 156 of a transistor of the peripheral region B together with the conductive pattern 128b. A transistor of the peripheral circuit may include a high voltage transistor and a low voltage transistor.

Referring to FIGS. 15 to 23, some other exemplary embodiments of the present invention are described. Described parts in aforementioned embodiments with reference to FIGS. 3 to 5 may be applied to the present embodiments.

Figure 15:
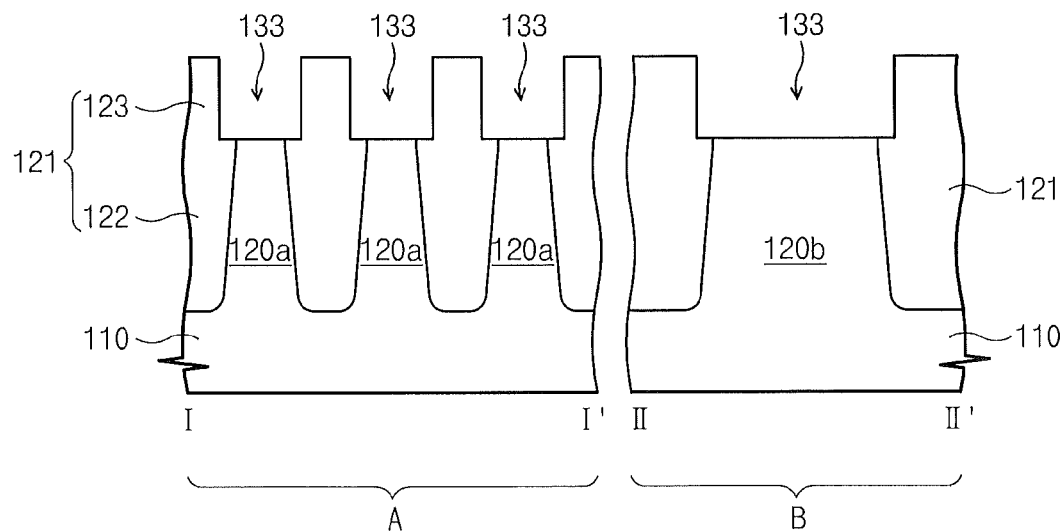
FIGS. 15 to 23 are cross sectional views taken along the lines I-I' and II-II' of FIG. 1 to illustrate a method of forming a nonvolatile memory device in accordance with some other exemplary embodiments of the present invention.

Referring to FIG. 15, an etching process is performed on a resultant structure as illustrated in FIG. 5. Some embodiments provide that the mask pattern 113 is removed and the device isolation layer 121 is formed. The device isolation layer 121 may include an upper device isolation layer 123 that is protruded upward from the active regions 120a and 120b and a lower device isolation layer 122 that is under the upper device isolation layer 123. A gap region 133 is defined on the active region 120a and 120b by the upper device isolation layers 123. The nitride layer pattern 115 may be removed by a wet etching using an etching solution including, for example, phosphoric acid. In some embodiments, the pad oxide layer pattern 114 may be removed by a wet etching using an etching solution including hydrofluoric acid (HF). When the pad oxide layer pattern 114 is removed, a portion of an upper portion of the device isolation layer 119 may be removed. A width of the gap region 133 may be greater than a width of the mask pattern 113 and a width of the upper device isolation layer 123 may be smaller than a width of the device isolation layer 119. After the pad oxide layer pattern 114 is removed, the width of the gap region 133 may become greater by performing an additional etching process.

Figure 16:
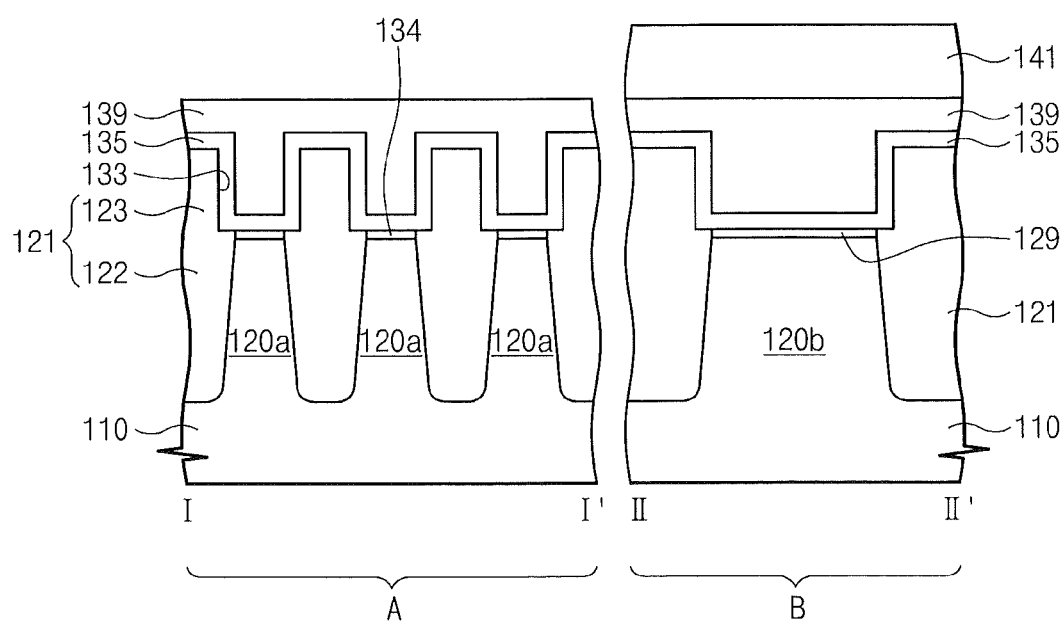

Referring to FIG. 16, a tunneling insulating layer 134 may be formed on the cell active region 120a. The tunneling layer 134 may be formed of a silicon oxide layer using, for example, a thermal oxidation process. An oxide layer 129 may be formed on the peripheral active region 120b by the thermal oxidation process.

A charge storage layer 135 is formed on the substrate 110. The charge storage layer 135 may be uniformly formed along a profile of the tunneling insulating layer 134, the oxide layer 129 and the upper device isolation 123. Some embodiments provide that the charge storage layer 135 may be formed of an insulating layer having a high trap density with respect to charges such as a nitride layer, an aluminum oxide layer ($Al_2O_3$), a hafnium oxide layer (HfO), a hafnium aluminum oxide layer (HfAlO), and/or a hafnium silicon oxide layer (HfSiO), among others, by performing, for example, an atomic layer deposition (ALD) process. The charge storage layer 135 may be also formed of an insulating layer including a nanocrystal and/or quantum dot, among others.

A sacrificial layer 139 filling the gap region 133 is formed on the charge storage layer 135. Some embodiments provide that the sacrificial layer 139 may be formed of material having an etching selectivity with respect to the charge storage layer 135. In some embodiments, the sacrificial layer 139 may be also formed of material having an etching selectivity with respect to the device isolation layer 121. For example, the sacrificial layer 139 may be formed of material having an etch rate that is higher than an etch rate of the device isolation layer and lower than an etch rate of the charge storage layer.

The sacrificial layer 139 and the device isolation layer 121 may be formed of the same material (e.g., a silicon oxide such as USG) and an etching selectivity with respect to each other may be controlled by performing an annealing process. That is, a density of the device isolation layer 121 becomes high by annealing the device isolation layer 121 while a density of the sacrificial layer 139 becomes lower than the device isolation layer 121 by annealing the sacrificial layer 139 under at least one different condition (e.g., a temperature or time) from that of the device isolation layer 121 or by not annealing the sacrificial layer 139. Accordingly, even though the sacrificial layer 139 and the device isolation layer 121 are formed of the same material, they may have an etching selectivity with respect to each other and the sacrificial layer 139 may be formed to have an etch rate higher than the device isolation layer 121. A mask pattern 141 is formed on the sacrificial layer 139 of the peripheral region B.

Figure 17:
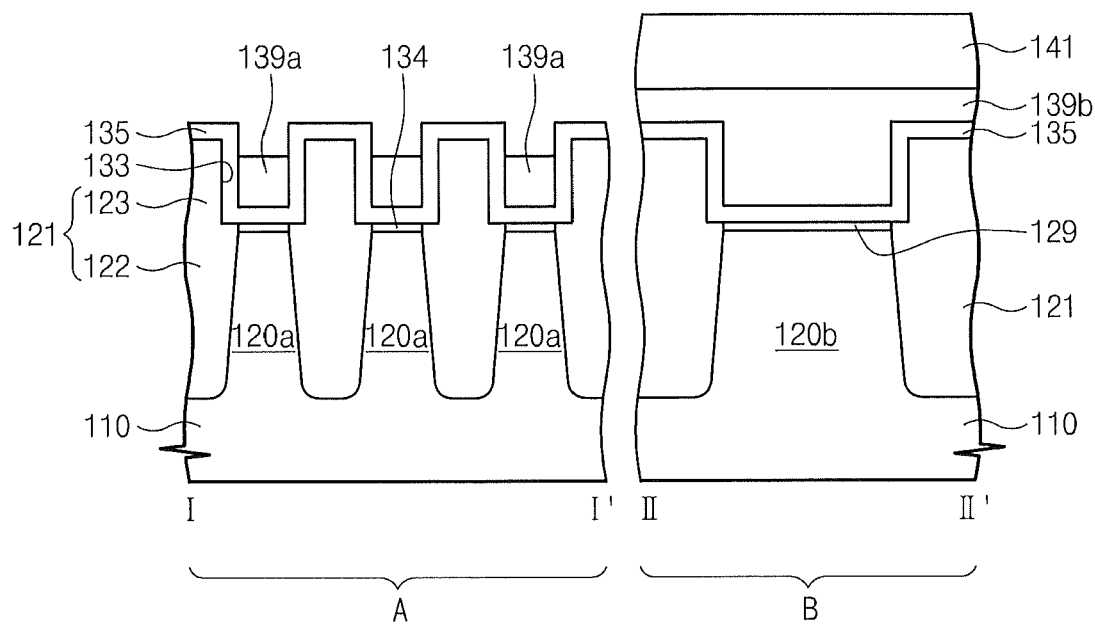

Referring to FIG. 17, the sacrificial layer 139 may be etched using the mask pattern 141 as an etch mask to form sacrificial patterns 139a and 139b on the cell and peripheral regions A and B, respectively. In some embodiments, the etching may be a wet etching using an etching solution including, for example, hydrofluoric acid (HF). The sacrificial pattern 139a is formed in the gap region 133, and the charge storage layer 135 on the upper device isolation layer 123 between the sacrificial patterns 139a is exposed.

Figure 18:
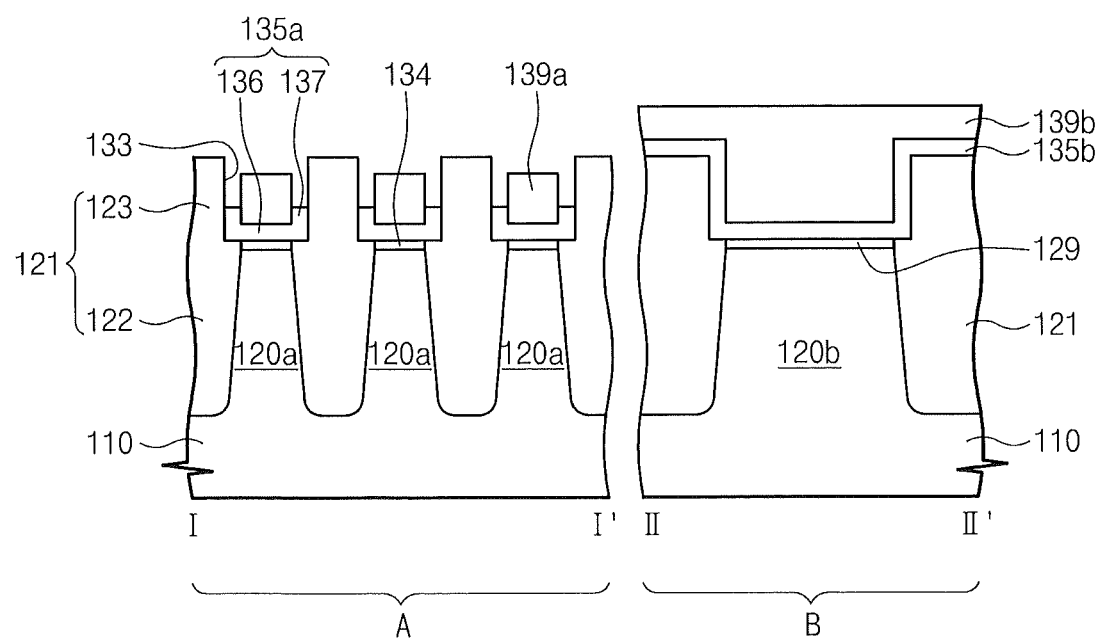

Referring to FIG. 18, after the mask pattern 141 is removed, the charge storage layer 135 is etched using the sacrificial patterns 139a and 139b as an etch mask to form charge storage patterns 135a and 135b on the cell and peripheral regions A and B, respectively. Since the charge storage pattern 135b of the peripheral region B is protected by the mask pattern 141, it is not etched remains substantially undivided on the peripheral device isolation layer 121b. However, the charge storage pattern 135a is etched on the cell device isolation layer 121 and is substantially divided thereon. Thus, the charge storage pattern 135a is formed only in a lower portion of the gap region.

In some embodiments, the charge storage pattern 135a of the cell region A may include a horizontal portion 136 and a protrusion 137. Some embodiments provide that the protrusion 137 is formed on an edge of the horizontal portion 136. The charge storage pattern 135a may have a cross section of a "U" shape and may surround a lower portion of the sacrificial pattern 139a.

Figure 19:
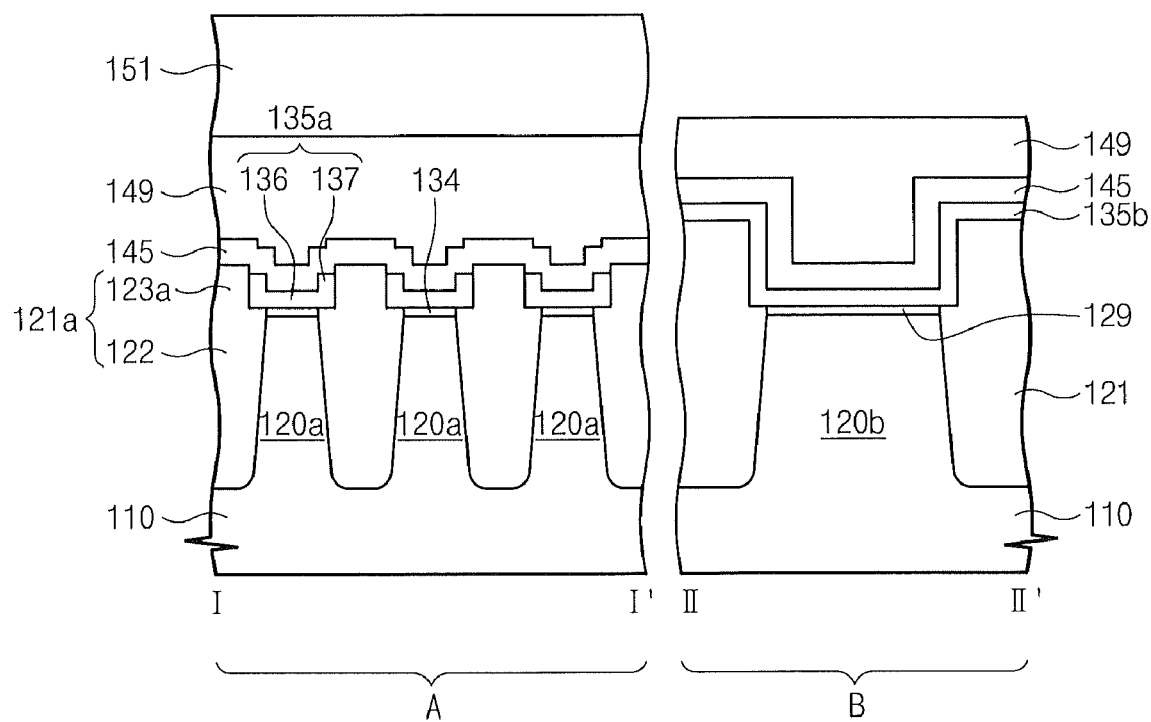

Referring to FIG. 19, an etching process is performed to recess the upper device isolation layer 123. A recessed device isolation layer 121a is formed. Some embodiments provide that a top surface of a recessed upper device isolation layer 123a may be higher than a top surface of the protrusion 137 of the charge storage pattern 135a. In some embodiments, the top surface of the recessed upper device isolation layer 123a may have the same height as the top surface of the protrusion 137 of the charge storage pattern 135a. The sacrificial patterns 139a and 139b may be etched and removed. As described above, because the density of the sacrificial patterns 139a and 139b are lower than the density of the device isolation layer 121, an etch rate of the sacrificial patterns 139a and 139b may be higher than an etch rate of the device isolation layer 121. In this regard, the sacrificial patterns 139a and 139b may all be removed while the upper device isolation layer 123 is recessed.

A blocking insulating layer 145 is formed on the recessed device isolation layer 121a and the charge storage patterns 135a and 135b. The blocking insulating layer 145 may be formed of a high dielectric-constant material such as an aluminum oxide layer ($Al_2O_3$), hafnium oxide ($HfO_2$), hafnium aluminate ($Hf_{1-x}AlO_y$), hafnium silicate ($Hf_xSi_{1-x}O_2$), hafnium silicon oxynitride (Hf—Si-oxynitride), oxyzirconium ($ZrO_2$), zirconium silicate ($Zr_xSi_{1-x}O_2$), and/or zirconium silicon oxynitride (Zr—Si-oxynitride), among others, by performing, for example, a chemical vapor deposition (CVD) process. The blocking insulating layer 145 may further include a barrier layer such as a silicon oxide layer for preventing a leakage current on an upper portion and/or under a lower portion of the blocking insulating layer 145.

A buffer layer 149 is formed on the blocking insulating layer 145 of the cell and peripheral regions A and B. A mask pattern 151 is formed on the buffer layer 149 of the cell region A.

Figure 20:
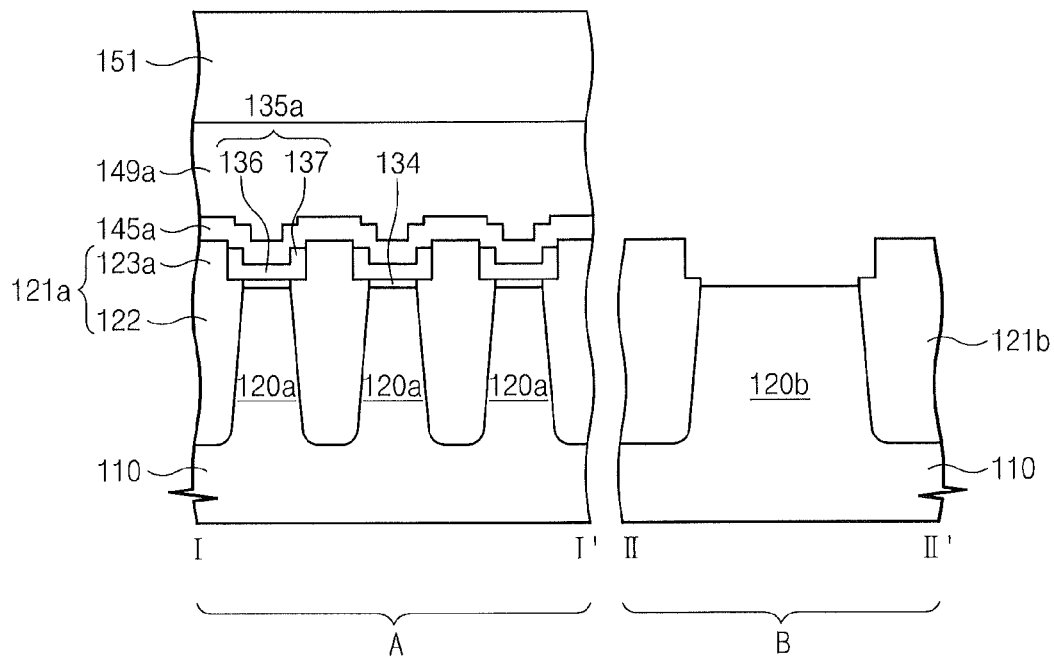

Referring to FIG. 20, the buffer layer 149, the blocking insulating layer 145, the charge storage pattern 135b and the oxide layer 129 of the peripheral region B are etched using the mask pattern 151 as an etching mask to expose the peripheral active region 120b. A blocking insulating layer pattern 145a and a buffer layer pattern 149a are formed on the cell region A.

Figure 21:
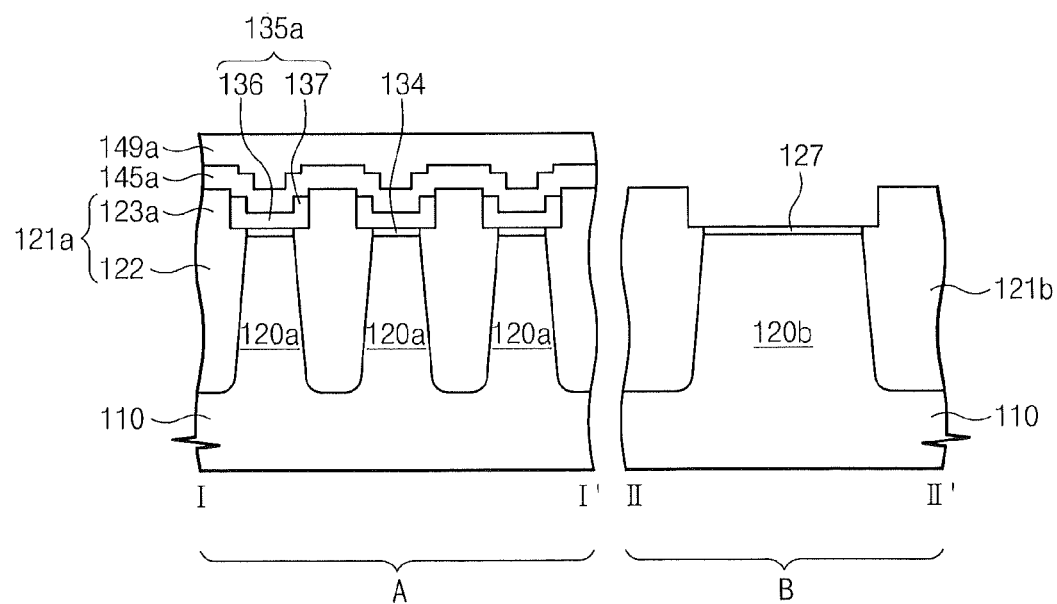

Referring to FIG. 21, after the mask pattern 151 is removed, an upper portion of the buffer layer 149a is removed. A peripheral gate insulating layer 127 is formed on the peripheral active region 120b. In some embodiments, the peripheral gate insulating layer 127 may be formed of silicon oxide by performing, for example, a thermal oxidation process.

Figure 22:
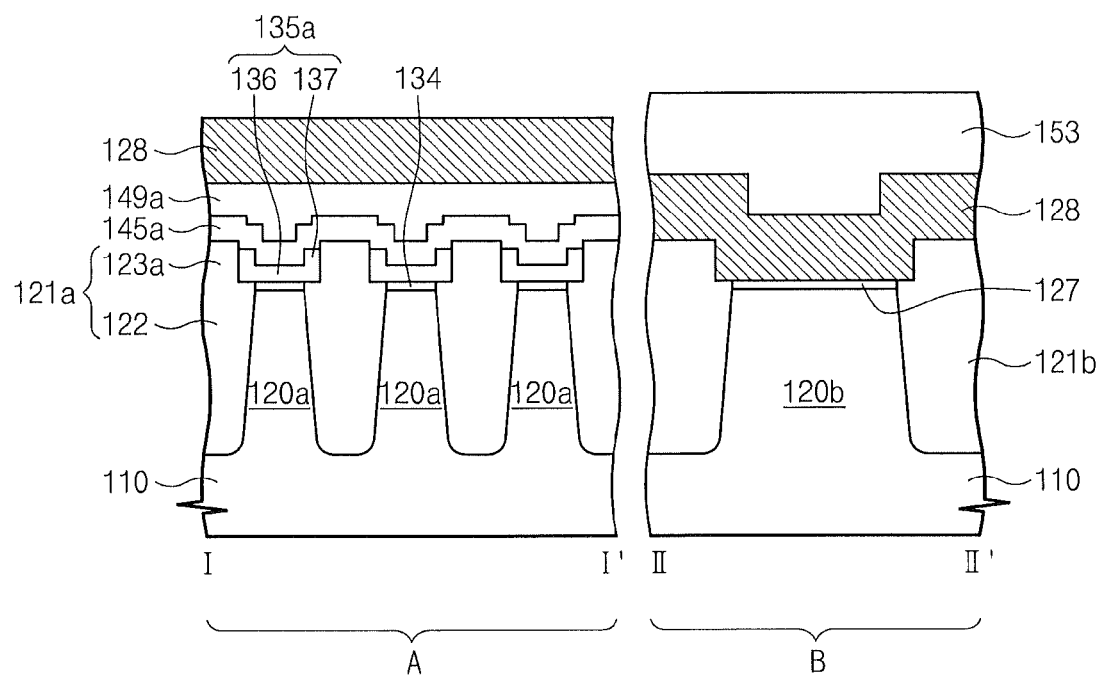

Referring to FIG. 22, a conductive layer 128 is formed on the substrate 110. Some embodiments provide that the conductive layer 128 may be formed of doped polysilicon by performing, for example, a chemical vapor deposition (CVD) process. A mask pattern 153 is formed on the conductive layer 128 of the peripheral region B.

Figure 23:
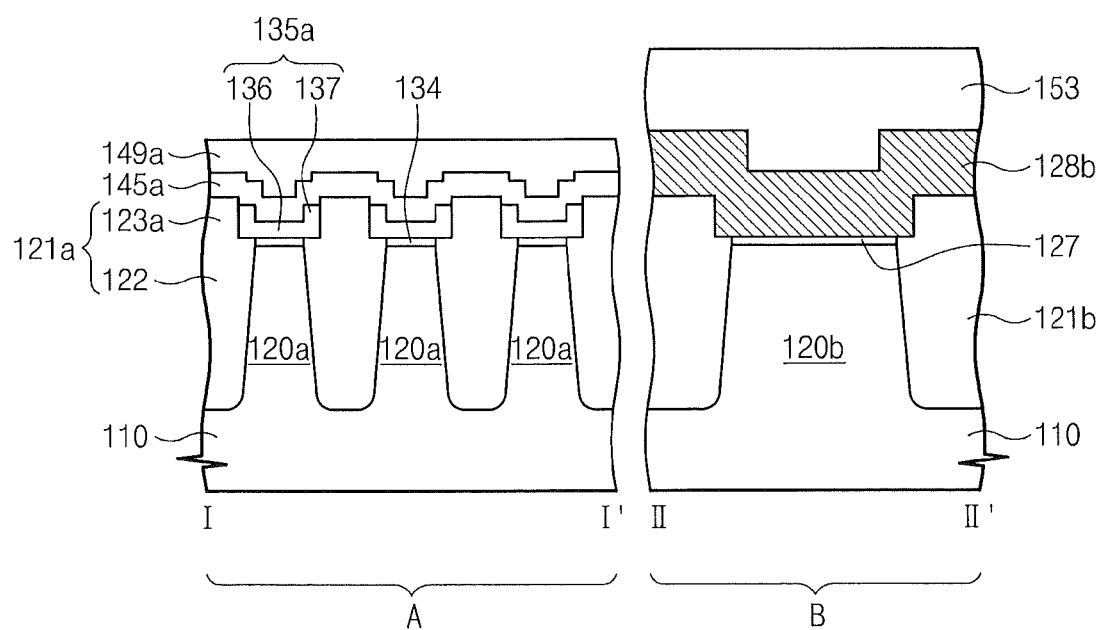

Referring to FIG. 23, the conductive layer 128 is etched using the mask pattern 153 as an etching mask to form a conductive pattern 128b on the peripheral region B. A buffer layer pattern 149a of the cell region A may function as an etch stop layer.

Referring to FIG. 2 again, after a conductive layer is formed on the substrate 110 where the buffer layer pattern 149a and the mask pattern 153 are removed, the conductive layer may be patterned to form the conductive pattern 155a on the cell region A and the conductive pattern 155b on the peripheral region B. Some embodiments provide that the conductive layer may be formed of metal. The conductive pattern 155a may function as a control gate line. The conductive pattern 155b and the conductive pattern 128b may function as a gate electrode 156 of a transistor of the peripheral region B. A transistor of the peripheral circuit may include, for example, a high voltage transistor and/or a low voltage transistor.

Figure 24:
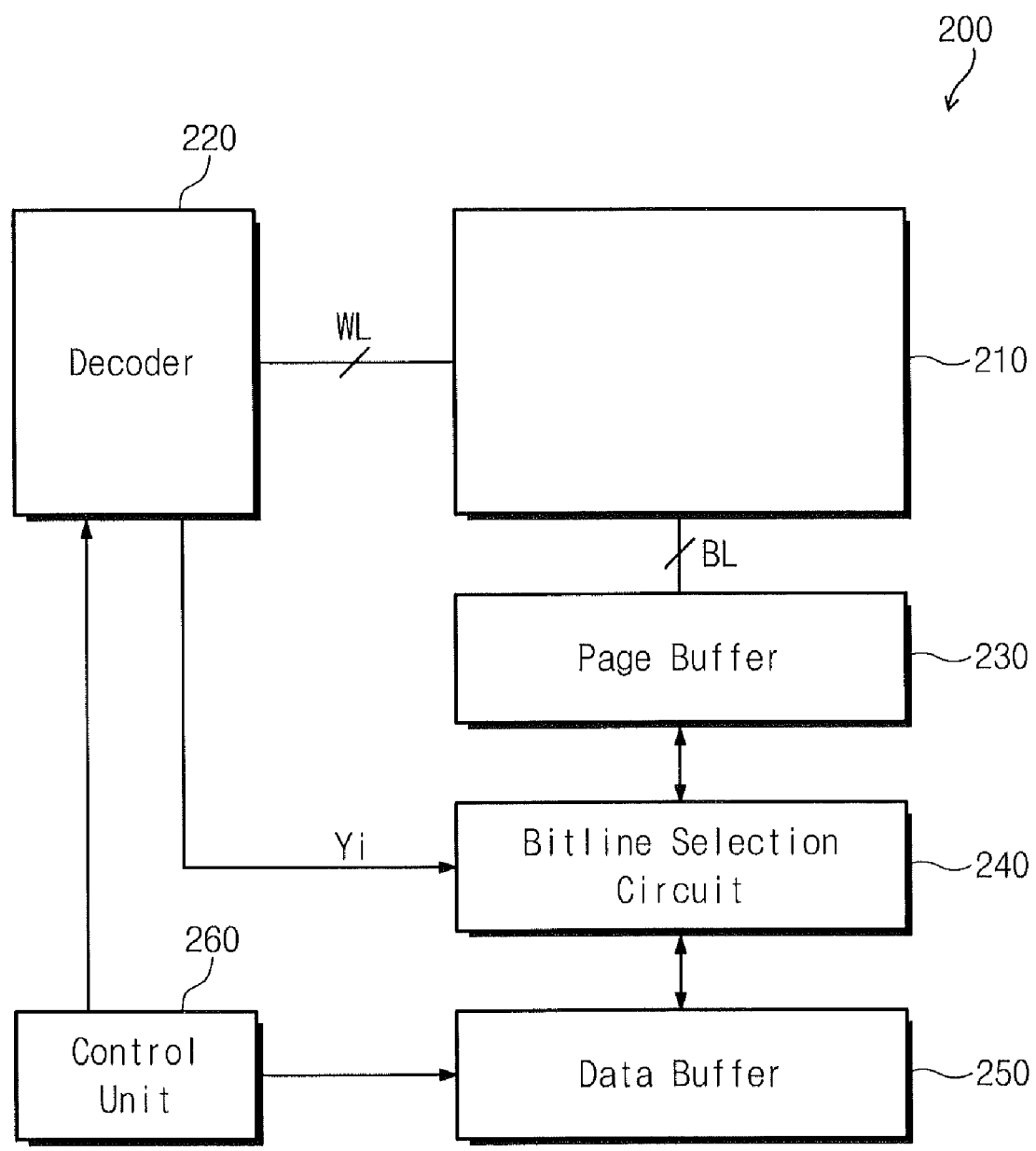
FIG. 24 is a block diagram of a nonvolatile memory device in accordance with some exemplary embodiments of the present invention.

FIG. 24 is a block diagram of a nonvolatile memory device in accordance with some exemplary embodiments of the present invention. In some embodiments, a semiconductor memory device 200 may include a cell array 210, a decoder 220, a page buffer 220, a bit line selection circuit 240, a data buffer and a control unit 260. Some embodiments provide that the semiconductor memory device 200 may be a NAND-type flash memory device.

The cell array 210 may include a plurality of memory blocks (not shown). Each memory block may include a plurality of pages (e.g., 32 pages, 64 pages). Each page may include a plurality of memory cells (e.g., 512 B, 2KB) sharing one word line (WL). In a NAND-type flash memory device, an erase operation may be performed on a memory block basis and read and write operations may be performed on a page basis.

Each page may store single bit data and/or multi bit data according to a mode signal (MOD).

The decoder 220 is connected to the cell array 210 through a word line and controlled by the control unit 260. Some embodiments provide that the decoder 220 receives an address (ADDR) from a memory controller (not shown) and generates a selection signal Yi so as to select a word line and/or a bit line. In some embodiments, the page buffer 230 is connected to the cell array 210 through a bit line.

In some embodiments, the page buffer 230 stores data loaded from a buffer memory (not shown). The page buffer 230 may load one page of data and the loaded data may be simultaneously programmed to a selection page when a program operation is performed. When a read operation is performed, the page buffer 230 may read data from a selection page and temporarily store the read data. Read data stored in the page buffer 230 responds to a read enable signal (not shown) and transfers to the buffer memory.

The bit line selection circuit 240 responds to the selection signal Yi and selects a bit line (BL). In some embodiments, the data buffer 250 is an input/output buffer used for transmitting data between the memory controller and the flash memory device 200. The control unit 260 receives a control signal from the memory controller and controls an internal operation of the flash memory device 200.

Figure 25:
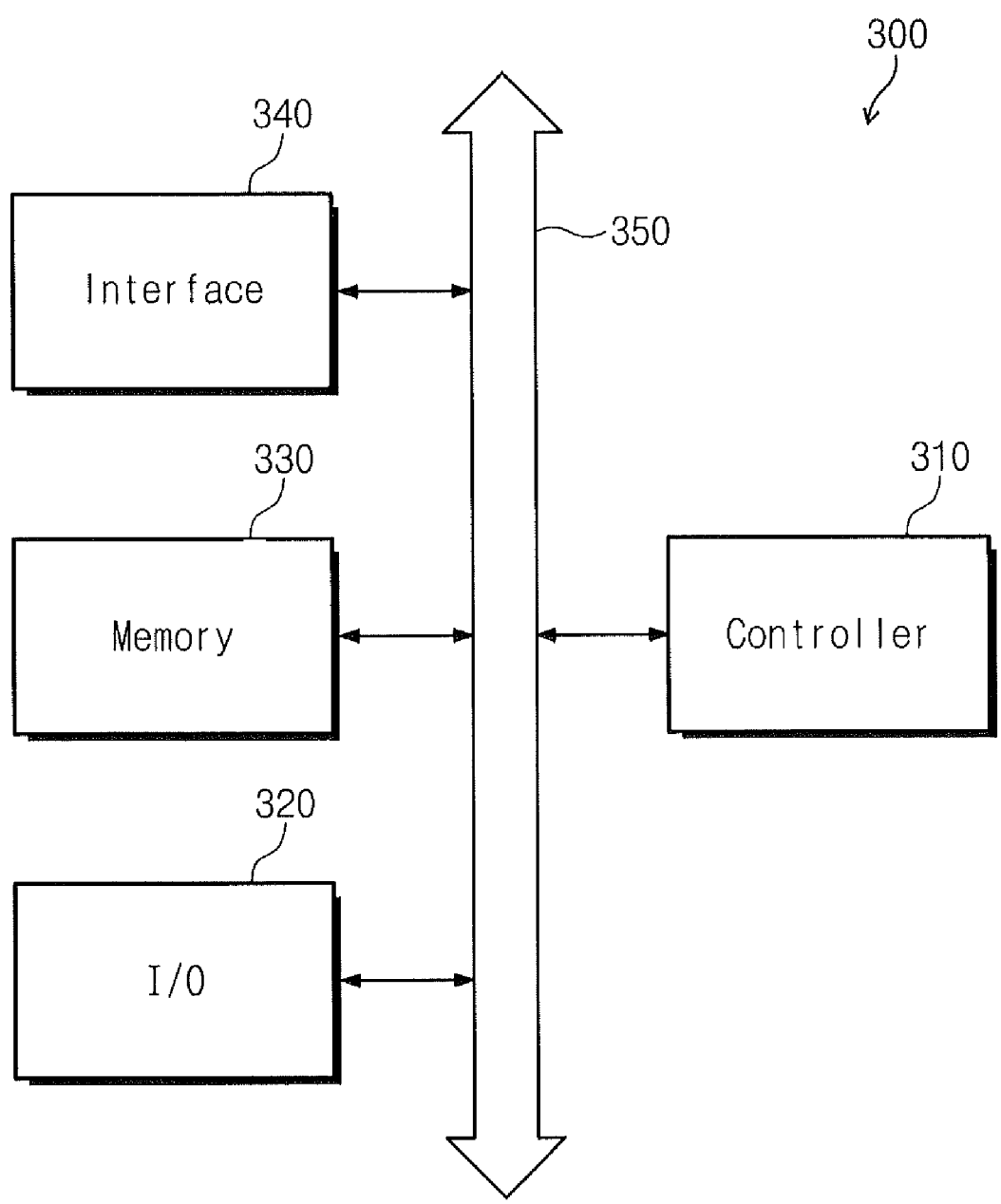
FIG. 25 is a system including a semiconductor memory device in accordance with some exemplary embodiments of the present invention.

Referring to FIG. 25, a system 300 including a semiconductor memory device in accordance with some embodiments of the present invention is described. Some embodiments of the system 300 may be used in wireless communication device (e.g., PDA, a laptop computer, a portable computer, a web tablet, a wireless phone and a cell phone), and/or in a device that can transmit and/or receive information in a wireless environment.

In some embodiments, the system 300 may include a controller 310, an input/output device such as a key pad, keyboard and/or a display, a memory 300, and a wireless interface 340. The controller 310 may include at least one microprocessor, digital signal processor, and/or microcontroller, among others. Some embodiments provide that memory 330 may be used for storing an instruction code executed by the controller 310. The memory 330 may also be used for storing a user data. The memory 330 may include a nonvolatile memory device in accordance with some embodiments of the present invention. The memory 330 may also include various kinds of memories and/or a random access volatile memory.

The system 300 may use a wireless interface 340 to transfer data to a wireless communication network that communicates by RF signal and/or to receive data from the wireless communication network that communicates by RF signal, among others. For example, the wireless interface 340 may include an antenna, and/or a wireless transceiver, among others.

The system 300 according to some embodiments of the present invention may be used in a communication protocol such as a third generation communication system (e.g., CDMA, GSM, NADC, E-TDMA, WCDMA and/or CDMA3000, among others).

Although the present invention has been described in terms of specific embodiments, the present invention is not intended to be limited by the embodiments described herein. Thus, the scope may be determined by the following claims.

What is claimed is:

1. A nonvolatile memory device, comprising:
a device isolation layer that defines an active region in a substrate; and
a first insulating layer, a nonconductive charge storage pattern, a second insulating layer and a control gate line that are sequentially stacked on the active region, wherein the charge storage pattern includes a horizontal portion and a protrusion disposed on an edge of the horizontal portion,
wherein the device isolation layer is disposed between the charge storage pattern and an adjacent charge storage pattern, and
wherein a top surface of an upper device isolation layer is free from the nonconductive charge storage pattern.

2. The device of claim 1, wherein the charge storage pattern comprises a charge trap layer.

3. The device of claim 1,
wherein the device isolation layer comprises the upper device isolation layer that protrudes upward from the active region.

4. The device of claim 1, wherein a top surface of the device isolation layer is higher than or equal to a top surface of the protrusion of the charge storage pattern.

5. The device of claim 1, wherein a width of the charge storage pattern is greater than a width of the active region.

* * * * *